United States Patent
Baughman et al.

(10) Patent No.: US 11,301,223 B2
(45) Date of Patent: Apr. 12, 2022

(54) ARTIFICIAL INTELLIGENCE ENABLED FUNCTION LOGIC INFUSION

(71) Applicant: INTERNATIONAL BUSINESS MACHINES CORPORATION, Armonk, NY (US)

(72) Inventors: Aaron K. Baughman, Cary, NC (US); Shikhar Kwatra, Durham, NC (US); Mauro Marzorati, Lutz, FL (US); Craig M. Trim, Ventura, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 112 days.

(21) Appl. No.: 16/544,653

(22) Filed: Aug. 19, 2019

(65) Prior Publication Data
US 2021/0055920 A1   Feb. 25, 2021

(51) Int. Cl.
*G06F 8/41*    (2018.01)
*G06F 30/20*   (2020.01)
*G06N 20/00*   (2019.01)

(52) U.S. Cl.
CPC ............. *G06F 8/433* (2013.01); *G06F 30/20* (2020.01); *G06N 20/00* (2019.01)

(58) Field of Classification Search
CPC ... G06F 8/433; G06F 8/36; G06F 8/72; G06F 8/443; G06F 8/456
See application file for complete search history.

(56) References Cited

U.S. PATENT DOCUMENTS

| | | | |
|---|---|---|---|
| 7,530,059 B2 | 5/2009 | Kielstra et al. | |
| 8,356,278 B2 | 1/2013 | Drissi et al. | |
| 9,383,973 B2 | 7/2016 | Villar et al. | |
| 2008/0052684 A1* | 2/2008 | Bowdidge | G06F 8/75 717/136 |
| 2010/0070948 A1* | 3/2010 | Rama | G06F 8/72 717/105 |
| 2010/0155464 A1 | 6/2010 | Swayn et al. | |

(Continued)

FOREIGN PATENT DOCUMENTS

| | | |
|---|---|---|
| CN | 101568927 | 2/2012 |
| CN | 108121563 | 6/2018 |
| WO | 2014093793 | 6/2014 |

OTHER PUBLICATIONS

Haney, "NPM & left-pad: Have We Forgotten How To Program?", https://www.davidhaney.io/npm-left-pad-have-we-forgotten-how-to-program/, Mar. 23, 2016, 2 pages.

(Continued)

*Primary Examiner* — Duy Khuong T Nguyen
(74) *Attorney, Agent, or Firm* — William Hartwell; Andrew D. Wright; Roberts Calderon Safran & Cole, P.C.

(57) ABSTRACT

Methods and systems for artificial intelligence enabled function logic infusion are disclosed. A method includes: determining, by a computing device, dependencies in code; packaging, by the computing device, the dependencies in the code into a container; determining, by the computing device, a portion of the code to move into a function; parallelizing, by the computing device, a data structure on which the portion of the code operates; and moving, by the computing device, the portion of the code into the container as the function, including the parallelized data structure.

25 Claims, 6 Drawing Sheets

(56) References Cited

U.S. PATENT DOCUMENTS

| | | | |
|---|---|---|---|
| 2011/0083118 A1* | 4/2011 | Moore | G06F 8/74 |
| | | | 717/110 |
| 2011/0271246 A1 | 11/2011 | Fujihara | |
| 2013/0275958 A1* | 10/2013 | Ivanov | G06F 8/61 |
| | | | 717/174 |
| 2016/0291950 A1* | 10/2016 | Yatou | G06F 8/456 |
| 2017/0212829 A1 | 7/2017 | Bales et al. | |
| 2017/0329588 A1* | 11/2017 | Lundberg | G06F 8/70 |
| 2018/0232211 A1 | 8/2018 | Maurya et al. | |
| 2018/0293463 A1 | 10/2018 | Brown | |
| 2020/0225917 A1* | 7/2020 | Jung | G06F 9/45558 |
| 2020/0379735 A1* | 12/2020 | Sutton | G06F 16/355 |
| 2021/0326130 A1* | 10/2021 | Fujii | G06F 8/72 |

OTHER PUBLICATIONS

Weinberger, "One programmer almost broke the internet by deleting 11 lines of code", https://www.businessinsider.com/npm-left-pad-controversy-explained-2016-3, Mar. 23, 2016, 4 pages.

Chen et al, "A Neural-Network Architecture for Syntax Analysis", IEEE Transactions on Neural Networks, vol. 10, No. 1, Jan. 1999, 21 pages.

Mell et al., "The NIST Definition of Cloud Computing", NIST, Special Publication 800-145, Sep. 2011, 7 pages.

International Search Report and Written Opinion of the International Searching Authority dated Nov. 10, 2020 in PCT Application No. PCT/IB2020/056942, 9 pages.

* cited by examiner

ARTIFICIAL INTELLIGENCE ENABLED FUNCTION LOGIC INFUSION

BACKGROUND

The present invention generally relates to computing devices and, more particularly, to methods and systems for artificial intelligence enabled function logic infusion.

Programmers may lack knowledge about existing functions (including restful functions and trigger-based functions) that are usable in an application or module that they are developing. Consequently, programmers may spend unnecessary time, effort, and expense writing code to perform actions that are already performed by existing functions or libraries that could be reused and incorporated into the application or module being developed. Additionally, during development of a particular application or module (e.g., for an enterprise), programmers may be unaware of portions of newly written code that may be reusable and therefore beneficial to embed into functions for future reuse (e.g., within the enterprise, in later runs or polling at intervals). This may also decrease efficiency during the development process.

When programmers are aware of an existing function usable in an application or module that they are developing, programmers may embed the existing function without regard to the existing function's dependencies on other functions or libraries. For example, a function may be recursive and reference other embedded functions. If the other functions or libraries that are dependencies are later unavailable, the function may stop working and cause the application or module to break.

SUMMARY

In a first aspect of the invention, there is a method that includes: determining, by a computing device, dependencies in code; packaging, by the computing device, the dependencies in the code into a container; determining, by the computing device, a portion of the code to move into a function; parallelizing, by the computing device, a data structure on which the portion of the code operates; and moving, by the computing device, the portion of the code into the container as the function, including the parallelized data structure. This aspect of the invention addresses the above-mentioned shortcomings associated with conventional programming techniques by providing artificial intelligence enabled function logic infusion.

In another aspect of the invention, there is a computer program product that includes a computer readable storage medium having program instructions embodied therewith. The program instructions are executable by a computing device to cause the computing device to: determine dependencies in code; package the dependencies in the code into a container; determine a portion of the code to move into a function; move the portion of the code into the container as the function; and determine triggers for the function. This aspect of the invention addresses the above-mentioned shortcomings associated with conventional programming techniques by providing artificial intelligence enabled function logic infusion.

In another aspect of the invention, there is a system that includes: a hardware processor, a computer readable memory, and a computer readable storage medium associated with a computing device; program instructions to determine dependencies in code; program instructions to package the dependencies in the code into a container; program instructions to determine a portion of the code to move into a function; program instructions to parallelize a data structure on which the portion of the code operates; and program instructions to move the portion of the code into the container as the function, including the parallelized data structure, wherein the program instructions are stored on the computer readable storage medium for execution by the hardware processor via the computer readable memory. This aspect of the invention addresses the above-mentioned shortcomings associated with conventional programming techniques by providing artificial intelligence enabled function logic infusion.

In another aspect of the invention, there is a method that includes: retrieving, by a computing device, a container including a function and dependencies; receiving, by the computing device, a service request from a cloud application having a portion of code moved into the function in the container; executing, by the computing device, the function in the container; and providing, by the computing device, a response to the service request based on the executing the function in the container. This aspect of the invention addresses the above-mentioned shortcomings associated with conventional programming techniques by providing artificial intelligence enabled function logic infusion.

In another aspect of the invention, there is a method that includes: determining, by a computing device, packages and environment variables on which code depends; determining, by the computing device, a portion of the code to move into a function based on a frequency of reuse of the portion of the code; parallelizing, by the computing device, a data structure on which the portion of the code operates; and packaging, by the computing device, a function comprising the portion of the code and the packages and the environment variables on which the code depends into a container. This aspect of the invention addresses the above-mentioned shortcomings associated with conventional programming techniques by providing artificial intelligence enabled function logic infusion.

In an optional aspect of the invention, the determining the dependencies in the code comprises determining packages and environment variables on which the code depends. In another optional aspect of the invention, the determining the portion of the code to move into the function comprises using artificial intelligence techniques. In another optional aspect of the invention, the parallelizing the data structure comprises performing a simulation by invoking the portion of the code a plurality of times and analyzing a change sequence of in-memory data structures. In another optional aspect of the invention, correlation models are used to determine data independence and determine whether or not the portion of the code is capable of running in parallel. In another optional aspect of the invention, the code is updated to include a reference linking to the function in the container. In another optional aspect of the invention, triggers for the function are determined. In another optional aspect of the invention, the container is layered together with other containers based on social use and pattern history. These optional aspects of the invention address the above-mentioned shortcomings by providing a cost-effective and tuned central processing unit (CPU)-based environment to execute algorithms that provides optimizations around budget and CPU usage.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION

Figure 1:
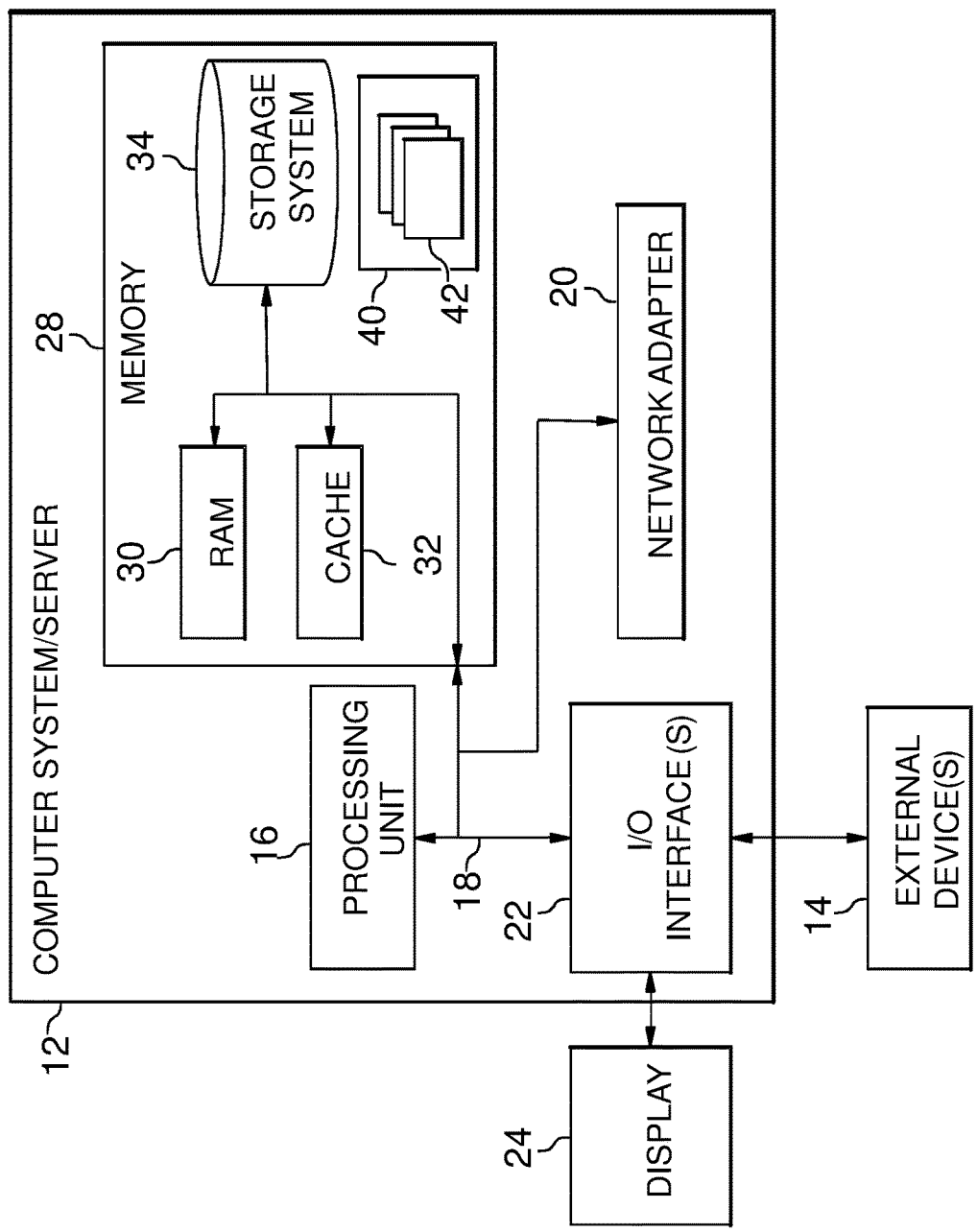
FIG. 1 depicts a cloud computing node according to an embodiment of the present invention.

The present invention generally relates to computing devices and, more particularly, to methods and systems for artificial intelligence enabled function logic infusion. As described herein, aspects of the invention include a functions infrastructure that provides a cost-effective and tuned CPU-based environment to execute algorithms that provides optimizations around budget and CPU usage. Aspects of the invention also include methods and systems that use artificial intelligence techniques to dynamically move parts of logic to a function. In particular, embodiments recommend lines of code which can be embedded into the function, based on a frequency of use of the code in different areas and a likelihood of reusing the code in order to maximize time efficiency and effort efficiency. Aspects of the invention also include methods and systems that document dependencies that are created upstream by the use of functions. Aspects of the invention also include methods and system that determine a number of parallel operations that run and create state content that is shared between parallel operations.

Aspects of the invention provide for the synthesis of functions based on functional aspects of code (e.g., what code does or code syntax) as well as non-functional aspects of code (e.g., scalability, performance, optimization, and parallelization). Aspects of the invention also provide for parallel function invocation determination based on runtime behavior. Aspects of the invention also provide for function trigger generation based on program frequency and trigger to map generation based on code runtime feature extraction.

Embodiments address problems associated with programmers unnecessarily spending time, effort, and expense to write code to perform actions that are already performed by existing functions or libraries. Embodiments also address problems associated with identifying portions of newly written code that may be reusable and therefore beneficial to embed into functions for future reuse. Embodiments also address problems associated with embedding existing functions without regard to dependencies on other functions or libraries.

Accordingly, embodiments improve the functioning of a computer by providing methods and systems for artificial intelligence enabled function logic infusion. In particular, embodiments improve software by providing a cost-effective and tuned CPU-based environment to execute algorithms that provides optimizations around budget and CPU usage. Embodiments also improve software by providing a method and system that use artificial intelligence techniques to dynamically move parts of logic to a function. Embodiments also improve software by providing a method and system that document dependencies that are created upstream by the use of functions. Embodiments also improve software by providing a method and system that determine a number of parallel operations that run and create state content that is shared between parallel operations. Additionally, implementations of the invention use techniques that are, by definition, rooted in computer technology (e.g., artificial intelligence, machine learning, deep learning, neural networks, and cloud computing).

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as Follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as Follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as Follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Referring now to FIG. 1, a schematic of an example of a cloud computing node is shown. Cloud computing node 10 is only one example of a suitable cloud computing node and is not intended to suggest any limitation as to the scope of use or functionality of embodiments of the invention described herein. Regardless, cloud computing node 10 is capable of being implemented and/or performing any of the functionality set forth hereinabove.

In cloud computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a nonremovable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

Figure 2:
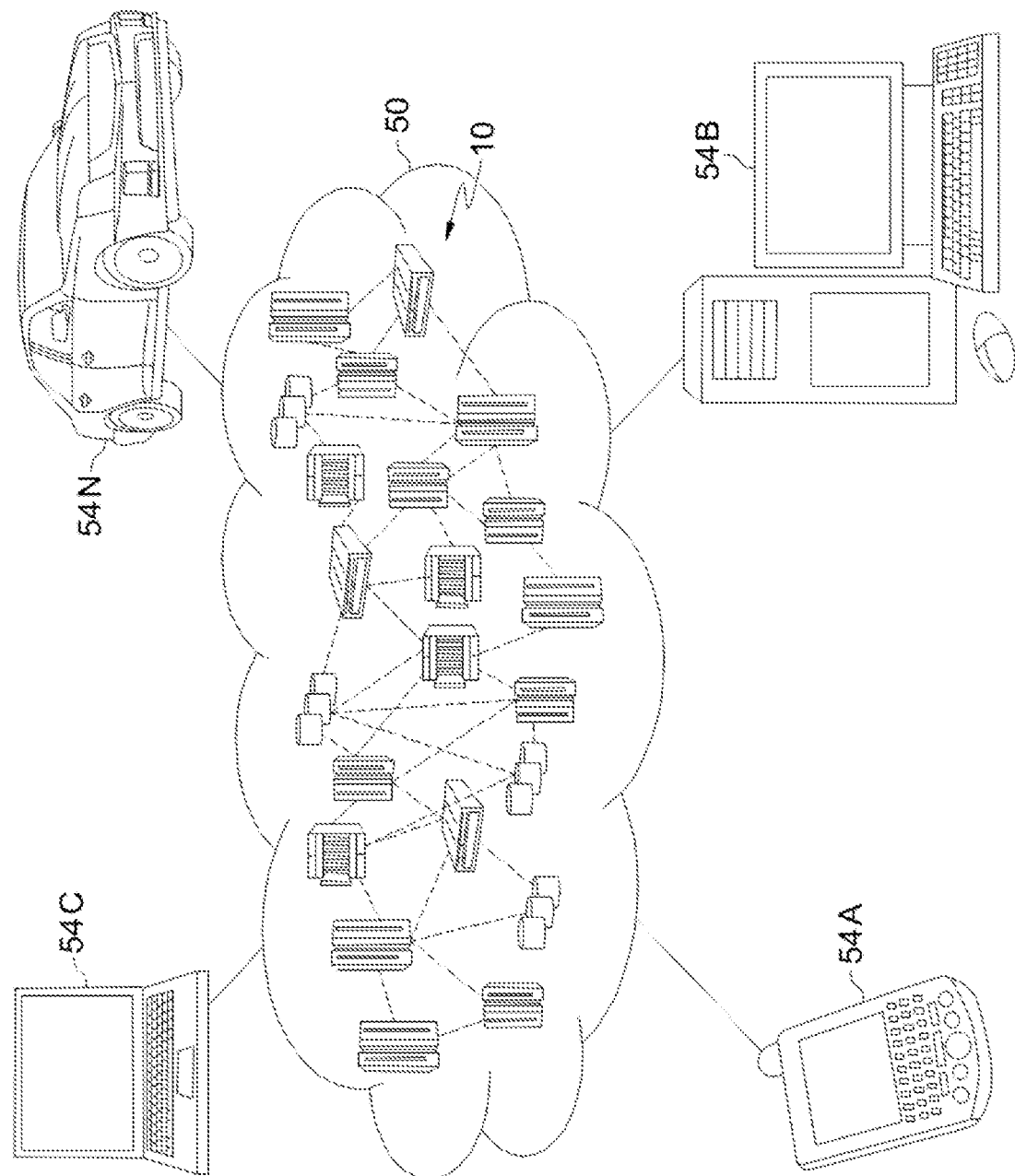
FIG. 2 depicts a cloud computing environment according to an embodiment of the present invention.

Referring now to FIG. 2, illustrative cloud computing environment 50 is depicted. As shown, cloud computing environment 50 comprises one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 2 are intended to be illustrative only and that computing nodes 10 and cloud computing environment 50 can communicate with any type of computerized device over any type of network and/or network addressable connection (e.g., using a web browser).

Figure 3:
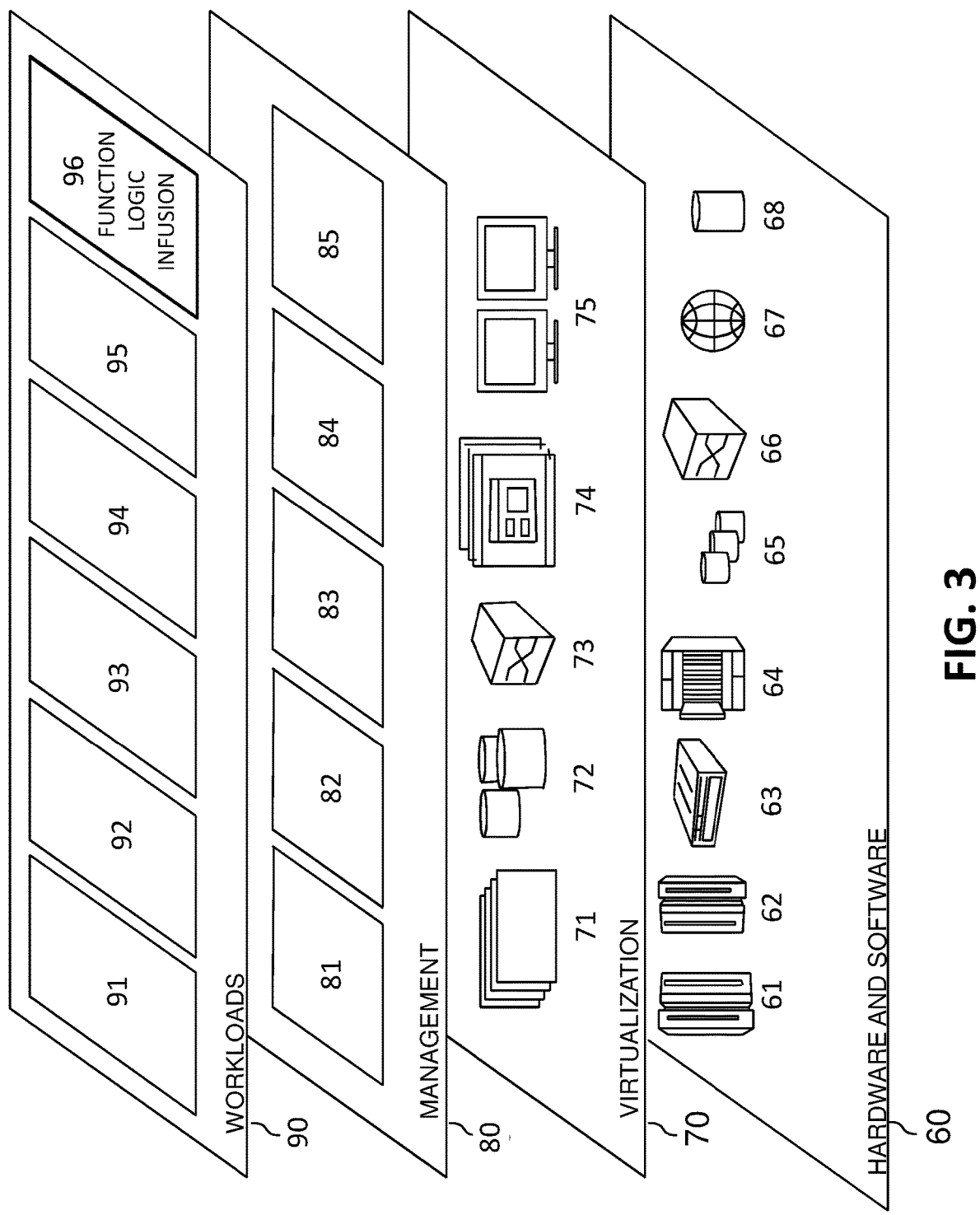
FIG. 3 depicts abstraction model layers according to an embodiment of the present invention.

Referring now to FIG. 3, a set of functional abstraction layers provided by cloud computing environment 50 (FIG. 2) is shown. It should be understood in advance that the components, layers, and functions shown in FIG. 3 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; Blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and function logic infusion 96.

Referring back to FIG. 1, the program/utility 40 may include one or more program modules 42 that generally carry out the functions and/or methodologies of embodiments of the invention as described herein (e.g., such as the functionality provided by function logic infusion 96). Specifically, the program modules 42 may use artificial intelligence techniques to dynamically move parts of logic to a function. Other functionalities of the program modules 42 are described further herein such that the program modules 42 are not limited to the functions described above. Moreover, it is noted that some of the modules 42 can be implemented within the infrastructure shown in FIGS. 1-3. For example, the modules 42 may be representative of a function logic infusion program module 410 as shown in FIG. 4.

Figure 4:
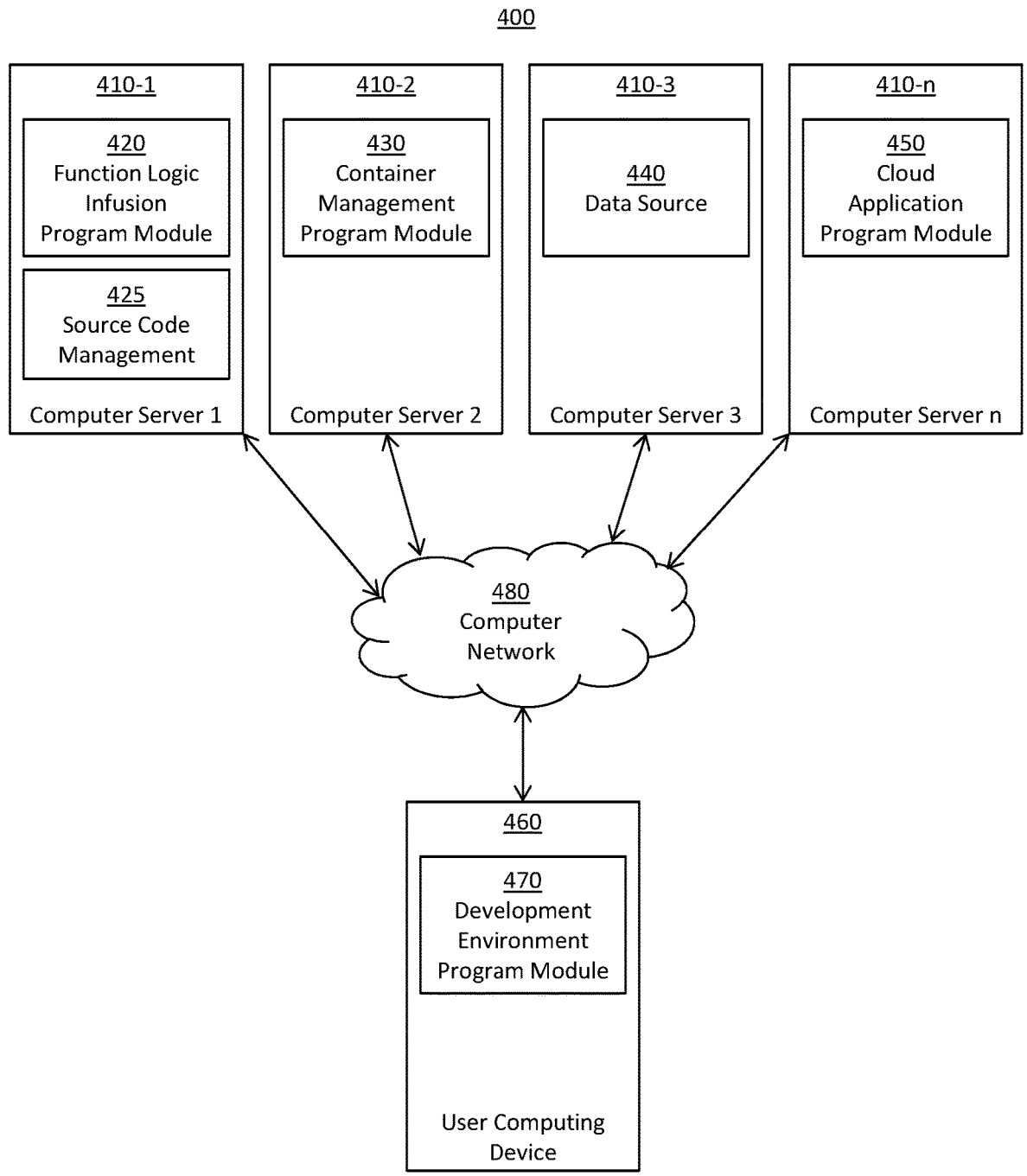
FIG. 4 depicts an illustrative environment in accordance with aspects of the invention.

FIG. 4 depicts an illustrative environment 400 in accordance with aspects of the invention. As shown, the environment 400 comprises a plurality of computer servers 410-1, 410-2, 410-3, . . . , 410-n and a user computing device 460 which are in communication via a computer network 480. In embodiments, the computer network 480 is any suitable network including any combination of a LAN, WAN, or the Internet. In embodiments, the plurality of computer servers 410-1, 410-2, 410-3, . . . , 410-n and the user computing device 460 are physically collocated, or, more typically, are situated in separate physical locations.

The quantity of devices and/or networks in the environment 400 is not limited to what is shown in FIG. 4. In practice, the environment 400 may include additional devices and/or networks; fewer devices and/or networks; different devices and/or networks; or differently arranged devices and/or networks than illustrated in FIG. 4. Also, in some implementations, one or more of the devices of the environment 400 may perform one or more functions described as being performed by another one or more of the devices of the environment 400.

In embodiments, each of the plurality of computer servers 410-1, 410-2, 410-3, . . . , 410-n is a cloud computing node 10 (as shown in FIG. 1). In embodiments, each of the plurality of computer servers 410-1, 410-2, 410-3, . . . , 410-n may be implemented as hardware and/or software using components such as mainframes 61; RISC (Reduced Instruction Set Computer) architecture based servers 62; servers 63; Blade servers 64; storage devices 65; networks and networking components 66; virtual servers 71; virtual storage 72; virtual networks 73, including virtual private networks; virtual applications and operating systems 74; and virtual clients 75 shown in FIG. 3.

In embodiments, the computer server 410-1 includes function logic infusion program module 420 which uses artificial intelligence techniques to dynamically move parts of logic to a function, as described below. In embodiments, the program instructions included in the function logic infusion program module 420 of the computer server 410-1 are executed by one or more hardware processors. In embodiments, the computer server 410-1 also includes source code management 425, which is a source code management system that provides version control and other source code management functionalities, as described below. In embodiments, the source code management 425 is implemented as hardware (e.g., network storage devices or any other storage) and/or software (e.g., program instructions executed by one or more hardware processors).

Still referring to FIG. 4, in embodiments, the computer server 410-2 includes container management program module 430 which provides container management and storage functionalities, as described below. In embodiments, the program instructions included in the container management program module 430 of the computer server 410-2 are executed by one or more hardware processors.

Still referring to FIG. 4, in embodiments, the computer server 410-3 includes data source 440 which may be a database (e.g., a relational database, flat file database, or any other type of database) or any other repository for data. In embodiments, the data source 440 is implemented as hardware (e.g., network storage devices or any other storage) and/or software (e.g., program instructions executed by one or more hardware processors).

Still referring to FIG. 4, in embodiments, the computer server 410-n includes cloud application program module 450, as described below. In embodiments, the program instructions included in the cloud application program module 450 of the computer server 410-n are executed by one or more hardware processors.

Still referring to FIG. 4, in embodiments, the user computing device 460 is a computer device comprising one or more elements of the computer system/server 12 (as shown in FIG. 1). In particular, the user computing device 460 is a desktop computer, a laptop computer, a mobile device such as a cellular phone, tablet, personal digital assistant (PDA), or other computing device.

In embodiments, the user computing device 460 includes the development environment program module 470, which is an integrated software development environment or any other tool for developing, testing, and/or managing software code. In embodiments, the program instructions included in the development environment program module 470 of the user computing device 460 are executed by one or more hardware processors.

Figure 5:
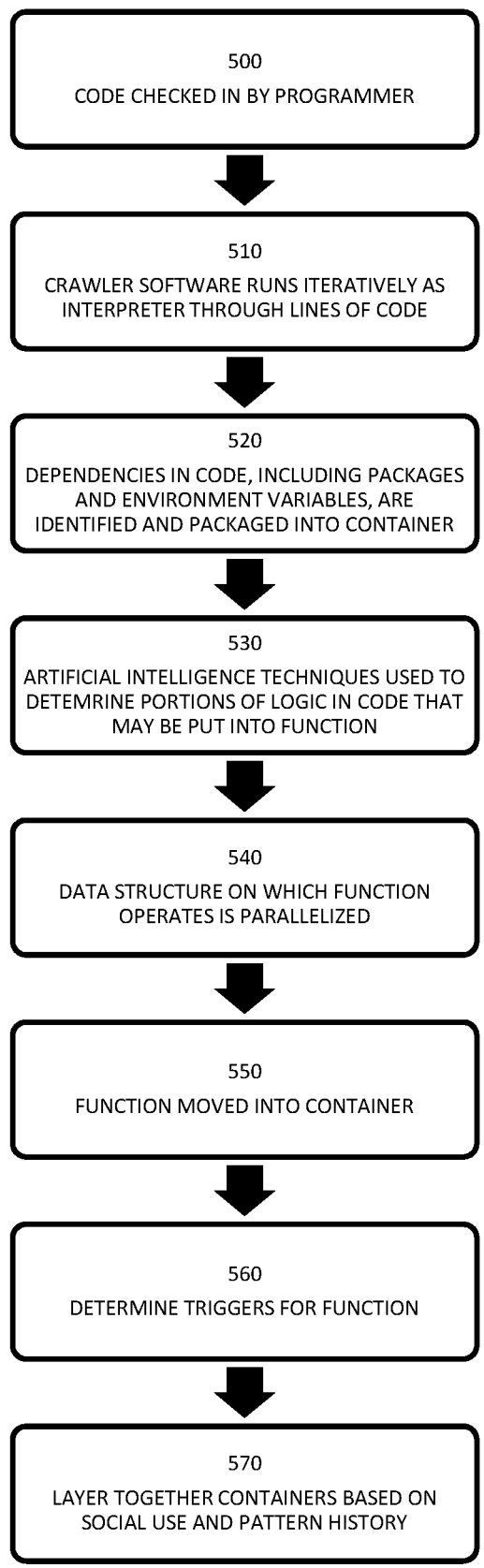
FIGS. 5 and 6 depict flowcharts of exemplary methods performed in accordance with aspects of the invention.

FIG. 5 depicts a flowchart of an exemplary method for using artificial intelligence techniques to dynamically move parts of logic to a function. The method of FIG. 5 is performed by the function logic infusion program module 420 of the computer server 410-1 in accordance with aspects of the invention. The steps of the method are performed in the environment of FIG. 4 and are described with reference to the elements shown in FIG. 4.

At step 500, using the user computing device 460, code is checked in by a programmer. In embodiments, a programmer who is writing software code using the development environment 470 running on the user computing device 460 checks in (e.g., pushes to a remote repository such as source code management 425) a portion of source code (e.g., a module, file, library, etc.) using the source code management 425 on the computer server 410-1.

Still referring to FIG. 5, at step 510, the computer server 410-1 iteratively runs crawler software as an interpreter thorough the checked-in code. In embodiments, the function logic infusion program module 420 running on the computer server 410-1 deploys the crawler software as an intermediary virtual layer which runs iteratively as an interpreter through lines of code in the backend. In particular, the crawler software deployed by the function logic infusion program module 420 runs through lines of code in the source code management 425 on the computer server 410-1 that were checked in at step 500.

Still referring to FIG. 5, at step 520, the computer server 410-1 determines dependencies in the code, including packages and environment variables, and packages the dependencies into a container. In embodiments, the crawler software of the function logic infusion program module 420 running on the computer server 410-1, while running through the lines of code in the source code management 425 on the computer server 410-1, determines explicit dependencies in the code, including the packages (e.g., other functions and/or software libraries) and the environment variables, that are relied upon by the code during execution. The crawler software of the function logic infusion program module 420 then packages the dependencies into a container. In embodiments, the container is a Docker container. Docker is an open-source project that automates the deployment of applications inside software containers by providing an additional layer of abstraction and automation of operating-system-level virtualization on Linux. (Note: the term(s) "Docker" and "Linux" may be subject to trademark rights in various jurisdictions throughout the world and are used here only in reference to the products or services properly denominated by the marks to the extent that such trademark rights may exist.) Certain terms used herein have an understood meaning within the context of Docker specifically and containerization generally. For example, an image is a collection of layers and constitutes a read-only template with instructions for creating a container. A build file is used to create an image, with each instruction in the build file creating a layer in the image. A container is a runnable instance of an image, i.e., an encapsulated environment that runs an application contained in the image. Although aspects of the invention are described with respect to containers, it is understood that implementations of the invention are not limited to use with Docker and may be used with other containerization programs.

Still referring to step 520, in embodiments, the crawler software of the function logic infusion program module 420 includes all dependencies in a dependency tree of each of the explicit dependencies in the container. In embodiments, the crawler software of the function logic infusion program module 420 packages the dependencies into an image, a zip or other archive file, or any other type of container. The container generated by the crawler software of the function logic infusion program module 420 includes functions relied upon by the code during execution as well as any environment variables that are relied upon by the code.

Still referring to FIG. 5, at step 530, the computer server 410-1 uses artificial intelligence techniques to determine portions of logic in the code that may be moved into a function. In embodiments, the function logic infusion program module 420 running on the computer server 410-1 uses artificial intelligence techniques to analyze the lines of code crawled by the crawler software of the function logic infusion program module 420 running on the computer server 410-1 at step 510 to determine the portions of logic in the code that may be moved into a function. In particular, the function logic infusion program module 420 analyzes the code to identify functions that may be synthesized based on functional aspects of code (e.g., what code does or code syntax) as well as non-functional aspects of code (e.g., scalability, performance, optimization, and parallelization).

In an example, in response to the function logic infusion program module 420 determining based on functional aspects that a portion of the code is likely to be reused, the function logic infusion program module 420 determines that the portion of the code may be moved into a function. The function logic infusion program module 420 may also determine based on non-functional aspects that a portion of the code is a good candidate for reuse (e.g., the portion of the code has favorable scalability, performance, optimization, and/or parallelization characteristics) and therefore determine that the portion of the code may be moved into a function. In particular, the function logic infusion program module 420 may use Big-O analysis to analyze the non-functional aspects of the portion of the code. In embodiments, the function logic infusion program module 420 automatically determines the portion of the code to be moved into a function. In other embodiments, the function logic infusion program module 420 recommends to a user (e.g., the programmer who checked in code at step 500) the portion of the code to be moved into a function, and the user approves or disapproves of the recommendation.

Still referring to FIG. 5, at step 540, the computer server 410-1 parallelizes a data structure on which the portion of the code operates. In embodiments, the function logic infusion program module 420 running on the computer server 410-1 parallelizes a data structure on which the portion of the code identified at step 530 operates. In particular, the function logic infusion program module 420 uses correlation models between data change to look for data independence and verify that the portion of the code identified at step 530 is capable of running in parallel. The function logic infusion program module 420 performs a simulation by invoking the portion of the code identified at step 530 a plurality of times as the function logic infusion program module 420 analyses in-memory data structures and the sequence with which they are changed. In an example, the following correlation model (Equation 1) is used to look for data independence:

$$\rho_{X,Y} = \mathrm{corr}(X, Y) = \frac{\mathrm{cov}(X, Y)}{\sigma_X \sigma_Y} = \frac{E[(X - \mu_X)(Y - \mu_Y)]}{\sigma_X \sigma_Y} \quad \text{Equation 1}$$

Still referring to step 540, the function logic infusion program module 420 determines whether or not the data structures used by the portion of the code identified at step 530 are independent and may be parallelized based on the simulation, including the correlation model used to look for data independence. If the function logic infusion program module 420 determines that the data structures used by the portion of the code identified at step 530 are not independent and therefore cannot be parallelized, then the function logic infusion program module 420 determines that the code identified at step 530 should not be moved into a function.

Still referring to FIG. 5, at step 550, the computer server 410-1 moves the function into a container. In embodiments, the function logic infusion program module 420 running on the computer server 410-1 moves (embeds) the portion of the code identified at step 530 into a new function which is stored in the container with the dependencies generated at step 520. In embodiments, the function logic infusion program module 420 stores the container in or using the container management 430 of the computer server 410-2. The code stored in the source code management 425 is then updated to include a reference linking to the new function.

Still referring to FIG. 5, at step 560, the computer server 410-1 determines triggers for the function. In embodiments, the function logic infusion program module 420 running on the computer server 410-1 creates actions with optional triggers, as well as maps to triggers. In particular, the function logic infusion program module 420 creates triggers for the function generated at step 550 over time by using artificial intelligence techniques to analyze how often the function runs and what conditions (e.g., values for particular variables) cause the function to run. The function logic infusion program module 420 dynamically updates/alters mappings between triggers based on an analysis of how the function is run, using artificial intelligence techniques.

Still referring to step 560, in embodiments, the function logic infusion program module 420 uses deep learning decision trees to determine the mappings between triggers. Each node within the deep learning decision tree interprets the data and creates meta features for determination. In an example, parallel runtime leaves are used based on code syntax and code runtime. A deep learning feedforward neural network outputs a summarization representation of parallel affinity. At this level, the tree will make a decision.

Still referring to FIG. 5, at step 570, the computer server 410-1 layers together containers based on social use and pattern history. In embodiments, the function logic infusion program module 420 running on the computer server 410-1 layers together the containers in the container management 430 into which the functions are moved at step 550, Based on social use (e.g., use within a particular enterprise) and pattern history (e.g., use by other programmers with similar styles) which is built over time during a training period for a given user or a plurality of users. Accordingly, programmers may share containers with similar driver programs that potentially may be combined into multiple function actions to give the programmer multiple options.

Still referring to step 570, in embodiments, the layered containers are used by the function logic infusion program module 420 to try multiple options for functions in code that is being developed, for example, in the development environment provided by the development environment program module 470 running on the user computing device 460. In particular, in embodiments, the function logic infusion program module 420 tests multiple functions generated by the function logic infusion program module 420 running on the computer server 410-1 and stored in containers in the container management 430 of the computer server.

In embodiments, the function logic infusion program module 420 identifies a best choice of the functions based on project requirements and then inserts the function (or recommends the function for insertion) into the code that is being developed. In machine learning applications, for example, the function logic infusion program module 420 may identify the best choice based on a function that optimizes accuracy for a given user. In commercial scenarios, for example, the function logic infusion program module 420 may identify the best choice based on licensing requirements of the overall project. In particular, in commercial scenarios, proper metering and accounting are important in order to avoid high costs as code is executed (e.g., in the case of a-la carte freemium models). The function logic infusion program module 420 uses artificial intelligence techniques to understand the implications of the decision in technical/performance terms (e.g., accuracy, CPU-efficiency, and memory-efficiency) as well as nontechnical/commercial terms (e.g., cost and licensing) of embedding often-used vs. seldom-used functions.

Figure 6:
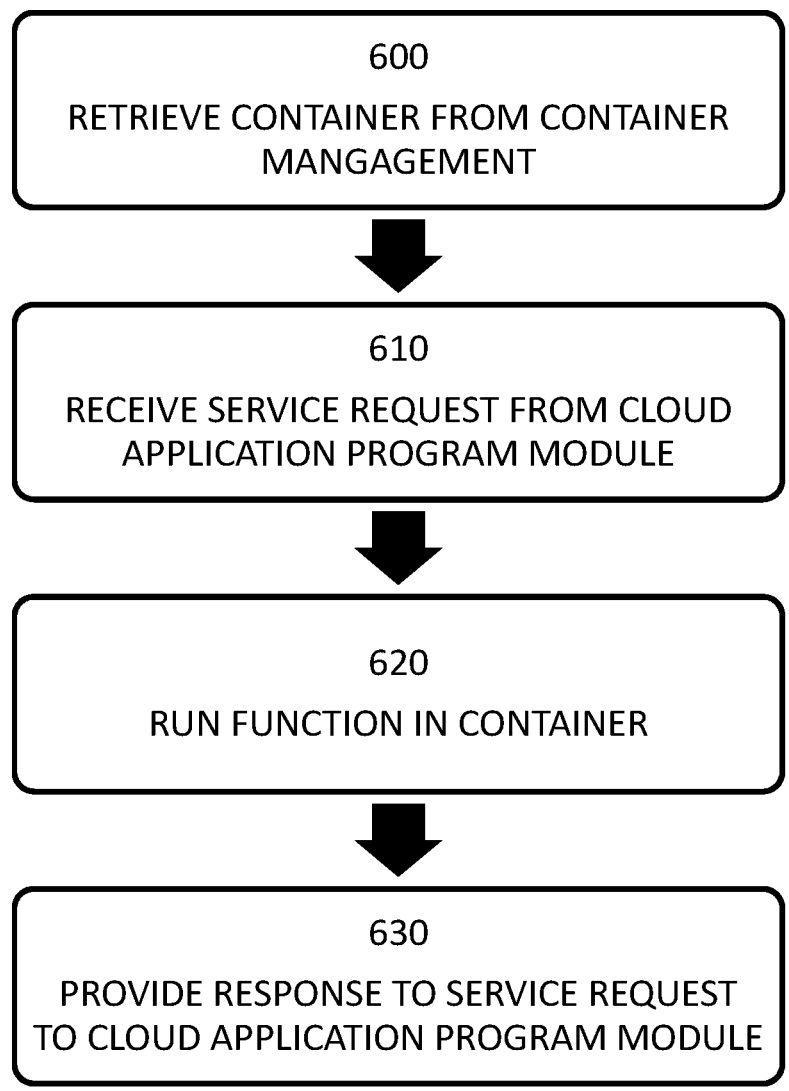

FIG. 6 depicts a flowchart of an exemplary method for using the functions generated by the function logic infusion program module 420 of the computer server 410-1. The steps of the method are performed in the environment of FIG. 4 and are described with reference to the elements shown in FIG. 4.

At step 600, the computer server 410-1 retrieves a container from the container management 430 on the computer server 410-2. In embodiments, the function logic infusion program module 420 running on the computer server 410-1 retrieves a container including a function from the container management 430 on the computer server 410-2.

Still referring to FIG. 6, at step 610, the computer server 410-1 receives a service request from a cloud application program module 450. In embodiments, the function logic infusion program module 420 running on the computer server 410-1 receives a service request from a cloud application program module 450 running on the computer server 410-*n*. In embodiments, the service request is a request to execute a function (e.g., a function including a portion of code that was moved out of the cloud application program module 450).

Still referring to FIG. 6, at step 620, the computer server 410-1 runs the function in the container. In embodiments, the function logic infusion program module 420 running on the computer server 410-1 runs the function requested at step 610 in the container retrieved at step 600, which includes dependencies required by the function (e.g., other functions and/or software libraries). In embodiments, the function logic infusion program module 420 retrieves data from the data source 440 on the computer server 410-3 to use in the executing of the function.

Still referring to FIG. 6, at step 630, the computer server 410-1 provides a response to the service request to the cloud application program module 450. In embodiments, the function logic infusion program module 420 running on the computer server 410-1 provides data (e.g., a result from the execution of the function) to the cloud application program module 450 running on the computer server 410-*n* as a response to the service request.

Accordingly, it is understood from the foregoing that the function logic infusion program module 420 provides an artificial intelligence system that dynamically moves parts of logic to a function and that recommends lines of code which can be embedded into the function based on frequency of use of the code in different areas and a likelihood of reusing a given piece of code for maximizing time/effort efficiency. Additionally, the function logic infusion program module 420 documents the dependencies that are created upstream (e.g., by creating container including the dependencies). Additionally, the function logic infusion program module 420 provides an artificial intelligence system that determines a number of parallel operations that run and creates state content that is shared between operations.

It is also understood from the foregoing that the function logic infusion program module 420 provides for the synthesis of functions based on code syntax and code behavior, parallel function invocation determination based on runtime behavior, function trigger generation based on program frequency, and trigger to map generation based on code runtime feature extraction. In an example, the function logic infusion program module 420 generates a map showing various events that are triggers to portions of code that have been moved into functions by the function logic infusion program module 420.

In embodiments, a service provider could offer to perform the processes described herein. In this case, the service provider can create, maintain, deploy, support, etc., the computer infrastructure that performs the process steps of the invention for one or more customers. These customers may be, for example, any business that uses cloud computing technology. In return, the service provider can receive payment from the customer(s) under a subscription and/or fee agreement and/or the service provider can receive payment from the sale of advertising content to one or more third parties.

In still additional embodiments, the invention provides a computer-implemented method, via a network. In this case, a computer infrastructure, such as computer system/server 12 (FIG. 1), can be provided and one or more systems for performing the processes of the invention can be obtained (e.g., created, purchased, used, modified, etc.) and deployed to the computer infrastructure. To this extent, the deployment of a system can comprise one or more of: (1) installing program code on a computing device, such as computer system/server 12 (as shown in FIG. 1), from a computer-readable medium; (2) adding one or more computing devices to the computer infrastructure; and (3) incorporating and/or modifying one or more existing systems of the computer infrastructure to enable the computer infrastructure to perform the processes of the invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   determining, by a computing device, dependencies in code;
   packaging, by the computing device, the dependencies in the code into a container;
   determining, by the computing device, a portion of the code to move into a function;
   parallelizing, by the computing device, a data structure on which the portion of the code operates;
   providing, by the computing device, a recommendation to a user that the portion of the code be moved into the function;
   moving, by the computing device, the portion of the code into the container as the function, including the parallelized data structure in response to the user approving the recommendation;
   running, by the computing device, the function in the container; and
   updating, by the computing device, mappings between triggers for the function based on an analysis of how the function is run.

2. The method according to claim 1, wherein the determining the dependencies in the code comprises determining packages and environment variables on which the code depends.

3. The method according to claim 1, wherein the determining the portion of the code to move into the function comprises using artificial intelligence techniques.

4. The method according to claim 1, wherein the parallelizing the data structure comprises performing a simulation by invoking the portion of the code a plurality of times and analyzing a change sequence of in-memory data structures.

5. The method according to claim 4, further comprising:
   using, by the computing device, correlation models to determine data independence and determine whether or not the portion of the code is capable of running in parallel; and
   receiving, by the computing device, a service request which is a request to execute the function, wherein the container is an encapsulated environment that runs an application contained in an image.

6. The method according to claim 1, further comprising updating, by the computing device, the code to include a reference linking to the function in the container.

7. The method according to claim 1, further comprising determining, by the computing device, the triggers for the function.

8. The method according to claim 1, further comprising layering, by the computing device, the container together with other containers based on social use and pattern history.

9. A computer program product comprising a computer readable storage medium having program instructions embodied therewith, the program instructions executable by a computing device to cause the computing device to:
   determine dependencies in code;
   package the dependencies in the code into a container;
   determine a portion of the code to move into a function;
   provide a recommendation to a user that the portion of the code be moved into the function;
   move the portion of the code into the container as the function in response to the user approving the recommendation;
   determine triggers for the function;
   receive a service request which is a request to execute the function;
   run the function in the container; and
   update mappings between the triggers based on an analysis of how the function is run.

10. The computer program product according to claim 9, wherein the determining the dependencies in the code comprises determining packages and environment variables on which the code depends.

11. The computer program product according to claim 9, wherein the determining the portion of the code to move into the function comprises using artificial intelligence techniques.

12. The computer program product according to claim 9, the program instructions further being executable by the computing device to cause the computing device to parallelize a data structure on which the portion of the code operates.

13. The computer program product according to claim 12, wherein the parallelizing the data structure comprises performing a simulation by invoking the portion of the code a plurality of times and analyzing a change sequence of in-memory data structures.

14. The computer program product according to claim 9, the program instructions further being executable by the computing device to cause the computing device to use correlation models to determine data independence and determine whether or not the portion of the code is capable of running in parallel.

15. The computer program product according to claim 9, the program instructions further being executable by the computing device to cause the computing device to update the code to include a reference linking to the function in the container.

16. The computer program product according to claim 9, the program instructions further being executable by the computing device to cause the computing device to layer the container together with other containers based on social use and pattern history.

17. A system comprising:
   a hardware processor, a computer readable memory, and a computer readable storage medium associated with a computing device;
   program instructions to determine dependencies in code;
   program instructions to package the dependencies in the code into a container;
   program instructions to determine a portion of the code to move into a function;
   program instructions to provide a recommendation to a user that the portion of the code be moved into the function;
   program instructions to parallelize a data structure on which the portion of the code operates;
   program instructions to move the portion of the code into the container as the function, including the parallelized data structure in response to the user approving the recommendation;
   program instructions to receive a service request which is a request to execute the function;
   program instructions to run the function in the container; and
   program instructions to update mappings between triggers for the function based on an analysis of how the function is run,
   wherein the program instructions are stored on the computer readable storage medium for execution by the hardware processor via the computer readable memory.

18. The system according to claim 17, wherein the determining the dependencies in the code comprises determining packages and environment variables on which the code depends.

19. The system according to claim 17, wherein the determining the portion of the code to move into the function comprises using artificial intelligence techniques.

20. The system according to claim 17, wherein the parallelizing the data structure comprises performing a simulation by invoking the portion of the code a plurality of times and analyzing a change sequence of in-memory data structures.

21. The system according to claim 17, further comprising program instructions to use correlation models to determine data independence and determine whether or not the portion of the code is capable of running in parallel.

22. The system according to claim 17, further comprising program instructions to update the code to include a reference linking to the function in the container.

23. The system according to claim 17, further comprising program instructions to determine the triggers for the function.

24. A method comprising:
   retrieving, by a computing device, a container including a function and dependencies;
   receiving, by the computing device, a service request from a cloud application having a portion of a code moved into the function in the container, wherein the function is relied upon the code;
   running, by the computing device, the function in the container;
   determining, by the computing device, mappings between triggers using deep learning decision trees;
   updating, by the computing device, the mappings between the triggers for the function based on an analysis of how the function is run; and
   providing, by the computing device, a response to the service request based on the executing the function in the container.

25. A method comprising:
   determining, by a computing device, packages and environment variables on which code depends;

determining, by the computing device, a portion of the code to move into a function based on a frequency of reuse of the portion of the code;

parallelizing, by the computing device, a data structure on which the portion of the code operates;

providing, by the computing device, a recommendation to a user that the portion of the code be moved into the function;

moving, by the computing device, the portion of the code into the container as the function, including the parallelized data structure in response to the user approving the recommendation;

packaging, by the computing device, the function comprising the portion of the code and the packages and the environment variables on which the code depends into a container;

receiving, by the computing device, a service request which is a request to execute the function;

running, by the computing device, the function in the container; and updating, by the computing device, mappings between triggers for the function based on an analysis of how the function is run.

\* \* \* \* \*